(12) United States Patent
Akarvardar et al.

(10) Patent No.: US 9,881,830 B2
(45) Date of Patent: Jan. 30, 2018

(54) ELECTRICALLY INSULATED FIN STRUCTURE(S) WITH ALTERNATIVE CHANNEL MATERIALS AND FABRICATION METHODS

(71) Applicant: GLOBALFOUNDRIES Inc., Grand Cayman (KY)

(72) Inventors: Murat Kerem Akarvardar, Saratoga Springs, NY (US); Jody A. Fronheiser, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 214 days.

(21) Appl. No.: 14/590,591

(22) Filed: Jan. 6, 2015

(65) Prior Publication Data

US 2016/0197004 A1    Jul. 7, 2016

(51) Int. Cl.
| H01L 21/762 | (2006.01) |
| H01L 29/66  | (2006.01) |
| H01L 29/78  | (2006.01) |
| H01L 29/04  | (2006.01) |

(52) U.S. Cl.
CPC ...... H01L 21/76202 (2013.01); H01L 29/045 (2013.01); H01L 29/66795 (2013.01); H01L 29/785 (2013.01)

(58) Field of Classification Search
CPC .................. H01L 29/045; H01L 29/785; H01L 29/66795
See application file for complete search history.

(56) References Cited

U.S. PATENT DOCUMENTS

| 5,963,811 A | 10/1999 | Chem |
| 6,635,543 B2 | 10/2003 | Furukawa et al. |
| 8,673,718 B2 | 3/2014 | Maszara et al. |
| 9,224,736 B1 * | 12/2015 | Ching ................ H01L 27/0924 |
| 2006/0071213 A1 | 4/2006 | Ma et al. |
| 2007/0000897 A1 | 1/2007 | Ingle et al. |
| 2010/0163971 A1 | 7/2010 | Hung et al. |

(Continued)

OTHER PUBLICATIONS

Terrasi et al. "Rapid thermal oxidation of epitaxial SiGe thin films." Material Science and Engineering B89 (2002) 269-273.*

(Continued)

*Primary Examiner* — Michael Jung
*Assistant Examiner* — Mikka Liu
(74) *Attorney, Agent, or Firm* — Heslin Rothenberg Farley & Mesiti P.C.; Nathan B. Davis

(57) ABSTRACT

Semiconductor structures and fabrication methods are provided which includes, for instance, fabricating a semiconductor fin structure by: providing a fin structure extending above a substrate, the fin structure including a first fin portion, a second fin portion disposed over the first fin portion, and an interface between the first and the second fin portions, where the first fin portion and the second fin portion are lattice mismatched within the fin structure; and modifying, in part, the fin structure to obtain a modified fin structure, the modifying including selectively oxidizing the interface to form an isolation region within the modified fin structure, where the isolation region electrically insulates the first fin portion from the second fin portion, while maintaining structural stability of the modified fin structure.

14 Claims, 9 Drawing Sheets

(56) References Cited

U.S. PATENT DOCUMENTS

2014/0273423 A1    9/2014  Fronheiser et al.
2015/0048453 A1\*  2/2015  Ching ................ H01L 29/7856
                                                    257/347

OTHER PUBLICATIONS

Akarvardar et al., "FinFET With Electrically Isolated Active Region on Bulk Semiconductor Substrate and Method of Fabricating Same", U.S. Appl. No. 13/945,455, filed Jul. 18, 2013, 15 pages.

\* cited by examiner

ELECTRICALLY INSULATED FIN STRUCTURE(S) WITH ALTERNATIVE CHANNEL MATERIALS AND FABRICATION METHODS

BACKGROUND

Semiconductor structures, such as, integrated circuits are formed from semiconductor substrates within and upon whose surfaces may be formed electrical circuit elements such as transistors including field-effect transistors (FETs). Conventionally, field-effect transistors have been fabricated as planar circuit elements.

Fin field-effect transistor (FinFET) devices are currently being developed to replace conventional planar transistors, such as metal oxide semiconductor field-effect transistors (MOSFETs), in advanced complementary metal oxide semiconductor (CMOS) technology, due to their improved short channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes etc.

As described by Moore's Law, the semiconductor industry drives down pattern dimensions in order to reduce transistor size and enhance processor speed at a rapid pace. Further enhancements in fin device structures and fabrication methods therefor continue to be pursued for enhanced performance and commercial advantage.

BRIEF SUMMARY

The shortcomings of the prior art are overcome and additional advantages are provided through the provision, in one aspect, of a method which includes, for instance, fabricating a semiconductor fin structure. The fabricating includes: providing a fin structure extending above a substrate, the fin structure including a first fin portion, second fin portion disposed over the first fin portion, and an interface between the first and the second fin portions, wherein the first fin portion and the second fin portion are lattice mismatched within the fin structure; and modifying, in part, the fin structure to obtain a modified fin structure, the modifying including selectively oxidizing the interface to form an isolation region within the modified fin structure, wherein the isolation region electrically insulates the first fin portion from the second fin portion, while maintaining structural stability of the modified fin structure.

In a further aspect, a semiconductor structure is provided which includes a substrate; and a fin structure residing over the substrate and including a first fin portion disposed over a second fin portion, wherein the first fin portion is lattice mismatched with the second fin portion, and the first fin portion is isolated from the second fin portion by an isolation region disposed therein.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
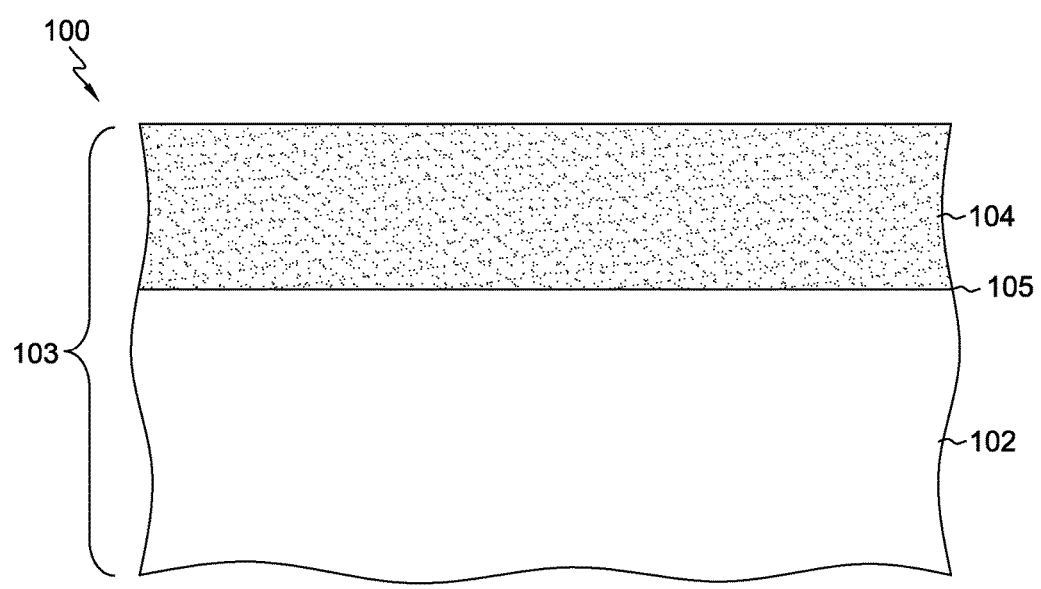
FIG. 1A is a cross-sectional view of a structure obtained during semiconductor fin fabrication process, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Disclosed herein, at least in part, is a method for fabricating an enhanced semiconductor structure such as, fin devices having, for instance, an isolation region within one or more fin structure(s) which facilitates isolating semiconductor fin structure(s) with, for instance, alternative channel materials. In one aspect, during the fabrication of semiconductor fin structures or fin(s), when an appropriate voltage is applied on a gate structure, charge carriers (for instance, electrons (generated by n-type dopants) or holes (generated by p-type dopants)) flow from a source region to a drain region of the transistor through the channel region. However, a leakage path from the source region to the drain region may arise through a portion of the fin not covered by the gate, but below the channel region. This leakage current from the source region to the drain region below the channel region is generally referred to as a punch-through leakage current, which can cause an increase in undesirable static power consumption, particularly, in modern nanoscale devices.

In order to reduce the punch-through leakage current, a punch-through stop dopant may be implanted, for instance, under the active portion of the fin, not covered by the gate. For instance, the punch-through stop dopant may include or be a dopant material that is different from the dopant materials employed during the fabrication of the source region and the drain region. As one example, the punch-through stop dopant may be implanted within a silicon fin via, for instance, a high energy ion implantation process to facilitate forming a desired punch-through stop region under the active fin. However, as the device dimensions decrease to enhance processor speed at a rapid pace, materials such as, for instance, III-V materials or germanium are employed as alternative materials for conventional bulk silicon substrates. Disadvantageously, punch-through stop dopants may undesirably diffuse or migrate within these alternative materials. For instance, the diffusivity of n-type punch-through stop dopants such as, for instance, arsenic and phosphorus through conventional silicon germanium (SiGe) substrate material tends to increase with an increasing concentration of germanium disposed therein. This in turn, could cause degradation in the mobility of charge carriers within the channel region, and therefore performance degradation of the resultant semiconductor structure(s). In addition, techniques employed to form punch-through stop regions may also introduce physical damage or defects to the other regions of the semiconductor device.

Generally stated, disclosed herein, in one aspect, is a method for fabricating a semiconductor fin structure. The fabricating method includes, for instance, providing a fin structure extending above a substrate, the fin structure including a first fin portion, a second fin portion disposed over the first fin portion, and an interface between the first and the second fin portions, where the first fin portion and the second fin portion are lattice mismatched within the fin structure; and modifying, in part, the fin structure to obtain a modified fin structure, the modifying including selectively oxidizing the fin interface to form an isolation region within the modified fin structure, where the isolation region electrically insulates the first fin portion from the second fin portion, while maintaining structural stability of the modified fin structure.

By way of example, the selectively oxidizing the interface may include selectively oxidizing the interface with a controlled oxidation process which extends oxidation into at least a portion of the first and the second fin portions forming the isolation region. For instance, the selectively oxidizing may include oxidizing the fin structure using an oxidizing time which facilitates selectively oxidizing the interface to a desired thickness, with the oxidizing time being selected to inhibit the oxidizing of the remaining portions of the first and the second fin portions. In one example, the isolation region may have a desired thickness within a range of about 5 to 15 nm. In one embodiment, the modifying includes disposing an oxide layer about the fin structure to mechanically stabilize the fin structure, with the oxide layer facilitating oxidizing of the fin structure selectively at the interface, and inhibiting oxidizing of the remaining portions of the first fin portion or the second fin portion. In one example, the fin structure may be surrounded and/or overlaid with the oxide layer and subsequently planarized to expose an upper surface of the first fin portion. In one example, the modifying may include annealing the fin structure in the absence of oxygen process gas to selectively oxidize the interface to obtain the isolation region. In such an example, the oxide layer surrounding the fin structure facilitates providing the oxygen atoms to facilitate oxidizing of the interface. In another example, the modifying may also include performing an oxidation process of the fin structure, in the presence of an oxygen process gas, to locally oxidize the interface of the fin structure, and form the isolation region within the modified fin structure.

In one embodiment, the second fin portion and the substrate may include or be fabricated of a silicon material, and the first fin portion may include or be fabricated of an intrinsically strained silicon germanium material. The intrinsically strained silicon germanium material may have, for instance, a specific atomic ratio of germanium to silicon disposed within the intrinsically strained silicon germanium material. In a specific example, the specific atomic ratio of germanium to silicon of the intrinsically strained silicon germanium material may be about 0.5 or more. Note that, the selectively oxidizing may include selecting the specific atomic ratio of germanium to silicon of the intrinsically strained silicon germanium material which facilitates determining an oxidizing time employed in the oxidizing of the interface.

In one aspect, the first fin portion includes a material with a first lattice constant, and the second fin portion and the substrate include a material with a second lattice constant, with the first and the second lattice constants being different lattice constant, and the first fin portion with the first lattice constant and the second fin portion with the second lattice constant induce an intrinsic strain within the first fin portion.

In one implementation, providing the fin structure may include: providing a bi-layer structure which includes the substrate. In one embodiment, the substrate may be or include a second fin layer; a first fin layer disposed over the substrate; and removing at least a portion of the bi-layer structure to create the fin structure, the fin structure including a region of the first fin portion, a region of the second fin portion disposed above the region of the first fin portion, and an interface between the first and the second fin portions.

In another implementation, providing the fin structure may include: providing an intermediate fin structure extending above the substrate, where the intermediate fin structure may include or be fabricated of a material of the second fin portion; disposing an oxide layer about the intermediate fin structure; etching at least a portion of the intermediate fin structure adjacent to the oxide layer to create a recessed fin structure above the substrate; and epitaxially growing a material of the first fin portion over the recessed fin structure, and planarizing the material of the first fin portion to be substantially coplanar with a surface of the oxide layer, and thereby define, at least in part, the fin structure to be modified. In such an example, the material of the second fin portion may include or be fabricated of a silicon material, and the material of the first fin portion may include or be fabricated of an intrinsically strained silicon germanium material having a specific atomic ratio of germanium to silicon disposed within the intrinsically strained silicon germanium material. In a specific example, the specific atomic ratio of germanium to silicon of the intrinsically strained silicon germanium material being about 0.5 or more.

In yet another implementation, providing the fin structure may include: providing a multi-layer structure which includes the substrate; a sacrificial layer over the substrate; the first fin layer disposed over the sacrificial layer; removing at least a portion of the multi-layer structure to create the fin structure. In this embodiment, the substrate may be or include a second fin layer. As noted, the fin structure may include a region of the first fin portion disposed over a region of the second fin portion, with a portion of the sacrificial layer disposed between the first fin portion and the second fin portions; and modifying, in part, the fin structure to obtain the modified fin structure, the modifying including oxidizing the sacrificial layer of the fin structure, while maintaining structural stability, where the oxidized sacrificial layer provides the isolation region. In this example, the second fin portion may include or be fabricated of a silicon material, and the sacrificial layer and the first fin layer may include or be fabricated of an intrinsically strained silicon germanium material, with the atomic ratio of germanium to silicon of the sacrificial layer being higher than the atomic ratio of germanium to silicon of the first fin layer. In a specific example, the atomic ratio of germanium to silicon disposed within the sacrificial layer may be about 0.5 or more, while the atomic ratio of germanium disposed within the first fin layer may be within a range of about 0.25 to 0.5.

An enhanced semiconductor structure is also provided herein which includes a substrate, and a fin structure residing over the substrate and including a first fin portion disposed over a second fin portion, with the first fin portion being lattice mismatched with the second fin portion, and the first fin portion being isolated from the second fin portion by an isolation region disposed therein. As noted, the second fin portion may include or be fabricated of a silicon material, and the first fin portion may include or be fabricated of an intrinsically strained silicon germanium material. The isolation region isolating the first fin portion from the second fin portion may be or include an oxide material such as, for instance, silicon oxide material, silicon germanium oxide material and/or a combination thereof.

Reference is made below to the drawings, which are not drawn to scale for ease of understanding, wherein the same reference numbers used throughout different figures designate the same or similar components.

FIGS. 1A-1G depict one example of a method for fabricating an enhanced semiconductor structure such as, fin devices with, for instance, an isolation region within one or more fin structure(s). Advantageously, as described below, the fabricating method facilitates isolating semiconductor fin structure(s) with, for instance, alternative channel materials such as, for instance, intrinsically strained silicon germanium materials from the underlying silicon material of the one or more fins by locally oxidizing interface between the two materials of the fin(s) forming the isolation region therebetween.

FIG. 1A illustrates a cross-sectional view of structure 100 obtained during fabrication of semiconductor structure, such as, a planar field-effect transistor or fin-type field-effect transistor, in accordance with one or more aspects of the present invention. As shown, structure 100 includes a substrate 102, which may be (in one example) a bulk semiconductor material such as a bulk silicon wafer in a crystalline structure with any suitable crystallographic orientation, for instance, (100), (111) and (110) orientations. By way of example, silicon substrate layer may have a planar (100) crystallographic surface orientation (referred to herein as (100) surface) and, where the substrate is a wafer, may further include a notch (not shown) at an edge of the wafer, along any suitable direction such as, for example <110> (most popular) or <100> direction. Note that the symbol <xyz> denotes the Miller index for a set of equivalent crystal directions, while the symbol (xyz) represents a crystal plane. In another example, substrate 102 may also include any silicon-containing substrate including, but not limited to, silicon (Si), single crystal silicon, polycrystalline Si, amorphous Si, silicon-on-nothing (SON), silicon-on-insulator (SOI), relaxed silicon germanium (SiGe) virtual substrates or silicon-on-replacement insulator (SRI) substrates or the like.

Continuing with FIG. 1A, first fin layer 104 may be disposed directly over substrate 102, creating a bi-layer structure 103. In one example, first fin layer 104 may be epitaxially grown or deposited over substrate 102, and may be an epitaxial single crystalline semiconductor layer. By way of example, first layer 104 may include, for instance, a crystalline structure that is similar to that of silicon substrate layer 102 and may include or be fabricated of a layer of silicon germanium, which may be expressed as $Si_{1-x}Ge_x$ wherein x, the atomic ratio of germanium to silicon, may be equal to or higher than 0.5. Silicon germanium layer 104 may be formed (for example) by various epitaxial growth processes such as ultra-high vacuum chemical vapor deposition (UHV-CVD), low-pressure CVD (LPCVD), reduced pressure CVD (RPCVD), rapid thermal CVD (RTCVD), or molecular beam epitaxy (MBE). In one example, the CVD-based epitaxial growth may take place at a temperature of about 400° C. to 800° C., while the MBE may typically use a lower temperature. In a specific example, the selective epitaxial growth of the silicon germanium layer may be performed using halogermanes and silanes as the source gases at temperatures below 600° C. A silicon germanium layer 104 may have a thickness of about 5 to 50 nm, depending on the metastable thickness of $Si_{1-x}Ge_x$ layer. In another example, the first fin layer may also include or be fabricated of materials such as, compound semiconductors including, for instance, indium phosphide (InP), gallium arsenide (GaAs) or InGaAs.

Figure 1B:
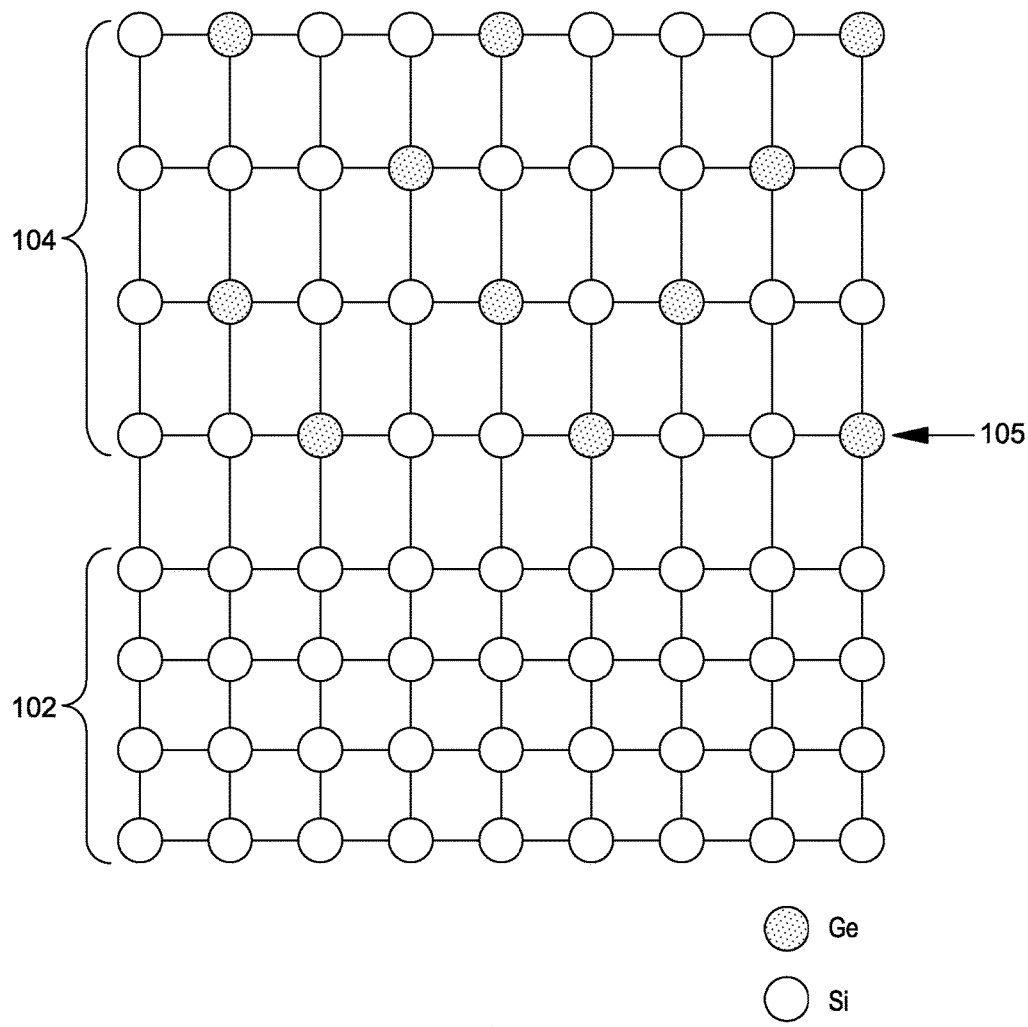
FIG. 1B depicts a schematic representation of lattice mismatch between crystalline lattice structures of the first and the second fin portions, in accordance with one or more aspects of the present invention.

Continuing with FIG. 1A, as noted, the difference in sizes of crystalline lattice structures of the respective silicon germanium layer 104 and silicon layer 102 will lead to a difference in their respective lattice constants. By way of example, when a material layer having a lattice constant different than that of the substrate is forced to epitaxially grow on the substrate, the overlying material layer becomes intrinsically strained in order to conform to the lattice structure of the underlying substrate layer. Accordingly, the substrate and the overlying silicon germanium layer have the same in-plane lattice constant along the height of bi-layer structure as shown in FIG. 1B. The matching of the two lattices with different lattice constants in their relaxed state induces strain in the overlying silicon germanium layer and the amplitude of the strain is proportional to the difference in lattice constants in the relaxed state. As used herein, "lattice mismatch" refers to a difference in lattice constants in relaxed state between silicon germanium layer 104 and underlying silicon layer 102. The difference in lattice constants between silicon germanium layer 104 and silicon substrate layer 102 results in an intrinsically strained silicon germanium layer 104, in particular, compressively strained silicon germanium layer 104 as silicon germanium layer 104 has a substantially greater lattice constant than that of the underlying silicon substrate 102.

For instance, as described above, the lattice constant of silicon germanium layer 104 is substantially greater than lattice constant of silicon substrate layer 102, and more particularly, within a range of about 50 to 100%. As discussed further below, in one embodiment, the lattice mismatch and the corresponding intrinsic strain between the silicon germanium layer and the silicon substrate layer results in interface 105 being susceptible to further modification processes relative to the remaining portions of the silicon germanium layer and the silicon substrate layer.

Further, the lattice mismatch of silicon germanium layer 104 and underlying silicon substrate layer 102 increases with an increase in the atomic ratio of germanium to silicon disposed within the silicon germanium layer, resulting in a distortion of the silicon germanium layer. This distortion of the silicon germanium layer may be minimized or inhibited, while increasing the intrinsic strain within the overlying silicon germanium layer by, for instance, controlling the thickness of the silicon germanium layer disposed over silicon substrate layer 102 (also referred to herein as "critical thickness") and/or optimizing the atomic ratio of the germanium to silicon disposed within the silicon germanium layer so as to achieve desired lattice mismatch and/or desired intrinsic strain within the overlying layer. For instance, the thickness of the silicon germanium layer 104 disposed over the silicon substrate layer 102 may be within a range of about 30 to 50 nm, while the atomic ratio of germanium to silicon disposed therein may be within a range of 50 to 100% so as to maintain an intrinsically strained silicon germanium material over the silicon layer.

Figure 1C:
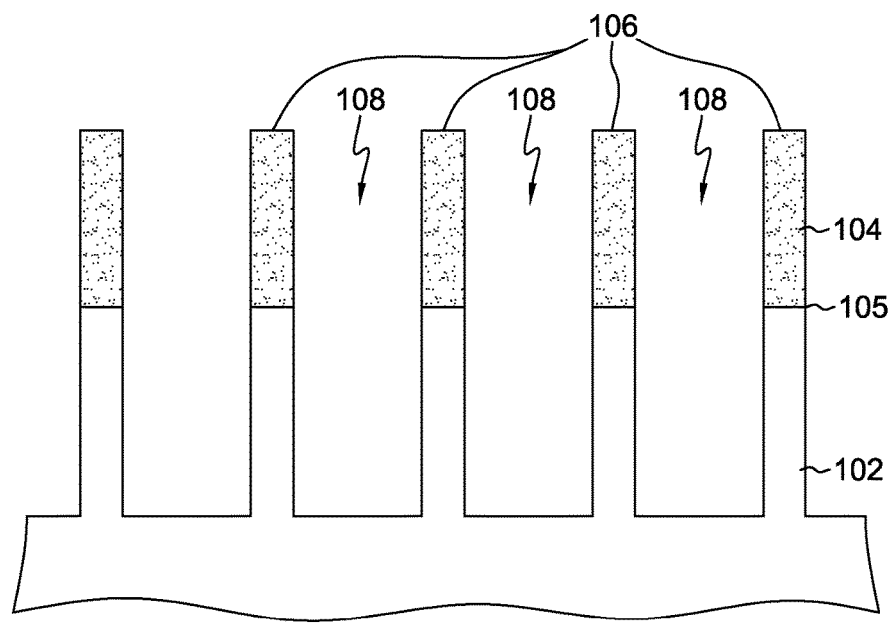
FIG. 1C depicts the structure of FIG. 1A after processing to create multiple fins from the bi-layer structure, in accordance with one or more aspects of the present invention.

Next, fin structure(s) or fin(s) 106 of FIG. 1C are formed by removing, for instance, one or more portions of bi-layer structure 103 (FIG. 1A), including a portion of silicon germanium layer 104, and silicon substrate layer 102. The resulting fins 106 may include a silicon germanium fin portion 104 and silicon portion 102, with the silicon germanium portion having interface 105 with the silicon substrate 102, as illustrated. Note that, in one embodiment, the silicon germanium portion defines the first fin portion, while the underlying silicon portion defines the second fin portion of fin(s) 106. By way of example, formation of fins 106 may be achieved through: patterning with various schemes; direct lithography; sidewall image transfer technique; extreme ultraviolet lithography (EUV); an e-beam technique; litho-etch; or litho-etch litho-freeze. The removal may be performed, for example, by any suitable etching process, such as an anisotropic dry etching process, for instance, reactive-ion-etching (RIE) in sulfur hexafluoride ($SF_6$). In one example, pairs of adjacent resulting fins 106 may be separated by openings 108.

Figure 1D:
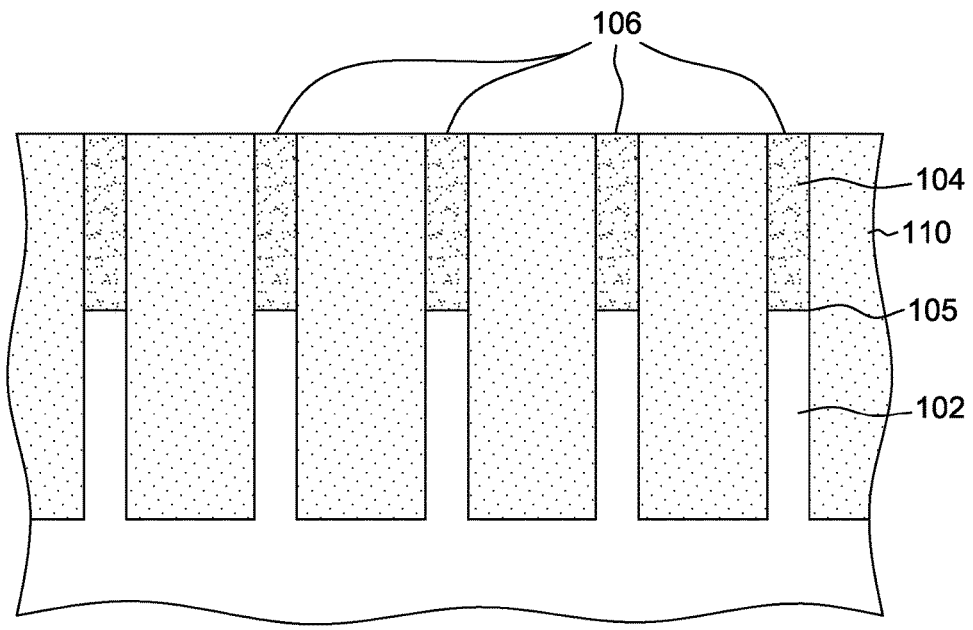
FIG. 1D depicts the structure of FIG. 1C after provision of a conformal oxide layer over the structure, in accordance with one or more aspects of the present invention.

FIG. 1D depicts the structure of FIG. 1C after one or more fins 106 have been surrounded and/or overlaid with an oxide layer 110. The thickness of the oxide layer may be (in one example) sufficient to allow subsequent planarization of the structure. In one embodiment, oxide layer 110 may be deposited, for example, using a high aspect ratio process (HARP). In one example, the HARP may include using an $O_3$/tetraethyl orthosilicate (TEOS) based sub-atmospheric chemical vapor deposition (SACVD) fill process which results in a conformal deposition of silicon oxide. A HARP deposition process, for instance, may be advantageous as a gap fill deposition within openings with high aspect ratios. In another example, oxide layer 110 may be a shallow trench isolation (STI) oxide, such as, silicon dioxide, flowable oxide, or a high-density plasma (HDP) oxide.

Figure 1E:
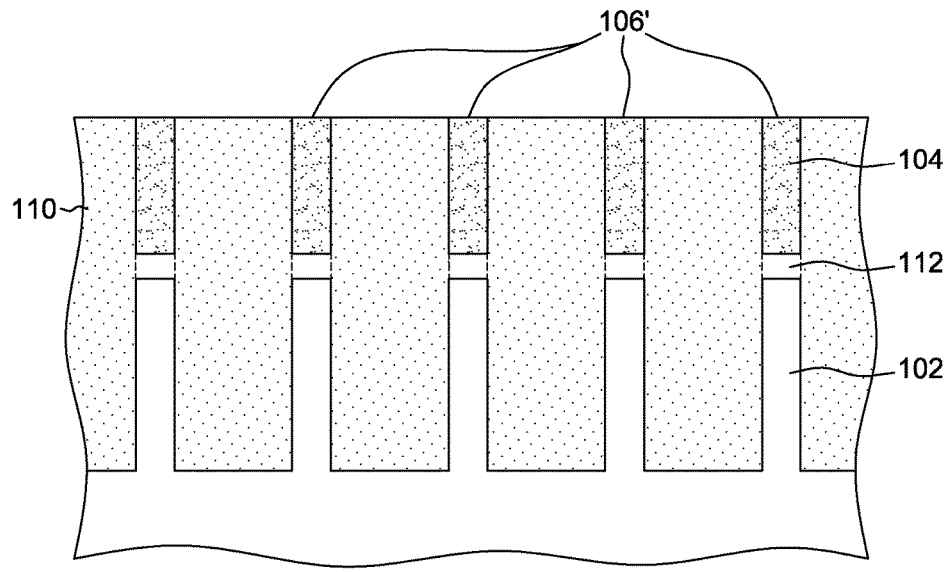
FIG. 1E depicts the structure of FIG. 1D with modified fin(s) including, for instance, an isolation region having been formed after oxidizing of an interface of the multiple fins, in accordance with one or more aspects of the present invention.

FIG. 1E illustrates the structure of FIG. 1D after subjecting fin(s) 106 (FIG. 1D) to a modification process in the presence of oxide layer 110, to facilitate modifying the fins, while maintaining structural stability of the modified fin(s). By way of example, the modification process may be accomplished, for instance, by selectively oxidizing interface 105 (FIG. 1D) to form an isolation region 112, which facilitates electrically insulating silicon germanium portion 104 from underlying silicon portion 102 of fin(s) 106 (FIG. 1D). The selective oxidation process may be performed, for instance, by subjecting fin(s) 106 (FIG. 1D) to a rapid thermal oxidation (RTO) procedure or by using a thermal annealing process. Performing oxidation or annealing of interface 105 (FIG. 1D) in the presence of oxide layer 110 surrounding the fins facilitates mechanical stability to the fins and prevents the fins from tilting due to stress caused by the oxidation of the interface. In one example, the isolation region 112 may be or include an oxide material such as, for instance, silicon oxide, silicon germanium oxide or combinations thereof. For instance, the silicon atoms of the silicon germanium layer and the silicon layer at the interface, owing to the intrinsic strain, may be oxidized, under the oxidation or annealing processes, to form the oxide material, for instance, silicon oxide material, resulting in the isolation region. In one specific example, the rapid thermal oxidation may be performed in the presence of process gases such as, for instance, oxygen, at about 800 to 1000° C. for about 5 sec to 10 mins so as to locally oxidize interface 105 (FIG. 1D), and form isolation region 112. In another specific example, annealing process may be performed using a furnace or rapid thermal annealing (RTA) process, in the absence of oxygen containing process gases, at a temperature of about 800 to 1100° C. for about 5 sec to 1 hour to selectively oxidize interface 105 (FIG. 1D) to obtain isolation region 112. In such an example, oxide layer 110 encapsulating the fin structure provides the oxygen atoms necessary to facilitate the oxidizing of interface 105. Further, a steam annealing process may also be employed at a temperature of about 500° C. for about 2 hours to selectively oxidize the interface.

Continuing with FIG. 1E, the modification process may be performed over the structure, and in particular, at interface 105 (FIG. 1D) of fin(s) 106 (FIG. 1D). As discussed above, the lattice mismatch and the corresponding intrinsic strain between the silicon germanium layer and the silicon substrate layer results in interface 105 being susceptible to further modification processes relative to the remaining portions of the silicon germanium layer and the silicon substrate layer. In one example, the selective oxidation process facilitates selectively oxidizing the interface by controlling one or more process parameters employed during the oxidation process. Advantageously, the controlled process parameters facilitate extending the oxidation process into at least a portion of the overlying silicon germanium layer and the underlying silicon layer forming isolation region 112 between intrinsically strained silicon germanium layer 104 and silicon layer 102. Additionally, the process parameters employed in the oxidation process may also be controlled so as to inhibit the oxidation of the remaining portions of the silicon germanium layer and the underlying silicon layer, resulting in a modified fin structure 106' with isolation region 112 isolating the silicon germanium layer from the underlying silicon layer. In a specific example, the oxidation of the interface may be performed by, for instance, controlling process parameters such as, for instance, time employed during the oxidation or annealing processes respectively, temperature and/or pressure to facilitate oxidizing the interface selectively to a desired thickness compared to the overlying silicon germanium layer or the underlying silicon layer. In a specific example, isolation region 112 may have a thickness within a range of about 5 to 15 nm. For instance, the oxidizing time being employed during the oxidation or the annealing processes may be selected to inhibit the oxidation of the remaining portions of the silicon germanium or the silicon layers. As one would expect, the more germanium that is disposed within the silicon germanium layer, the higher the likelihood of silicon germanium layer 104 to be susceptible to any of the modification processes being employed to selectively oxidize the interface. In such a case, the atomic ratio of the germanium to silicon disposed within the silicon germanium layer defines, for instance, the oxidizing time being employed during these processes. As a specific example, when the atomic ratio of the germanium to silicon is substantially higher than 0.5, the rapid thermal oxidation may be performed at a temperature of about 900° C. for about 1 min. In another specific example, the atomic ratio of germanium to silicon disposed within the silicon germanium layer may be substantially lower, particularly, between 0.25 to 0.5. In such case, the selective oxidation or annealing processes may be performed employing harsher oxidation conditions such as, for instance, higher temperatures and longer time so as to oxidize the interface selectively relative to the remaining portions of the silicon germanium layer and/or the silicon layer of the fins. Additionally, oxide layer 110 encapsulating fin(s) 106 (FIG. 1D) may also advantageously facilitate inhibiting or minimizing the oxidation of the silicon germanium layer or the silicon layer, while selectively oxidizing the interface of the fin(s), thereby maintaining the structural stability of modified fin(s) 106'.

Figure 1F:
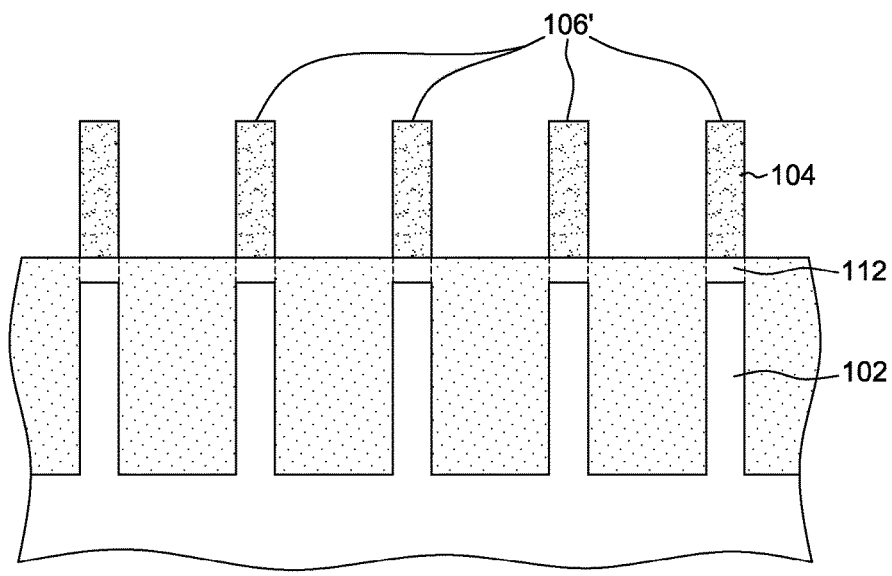
FIG. 1F depicts the structure of FIG. 1E after recessing the overlying oxide layer to reveal a portion of the modified fins, in accordance with one or more aspects of the present invention.

Further processing of the structure of FIG. 1F may be performed to reveal the isolated silicon germanium layers 104 of modified fins 106'. As depicted in FIG. 1F, oxide 110 is recessed through, for instance, the upper silicon germanium portions 104 of modified fins 106'. Any suitable etching process, such as an isotropic dry etching process, for example, SiCoNi etch process, may be employed to recess, for instance, the HARP oxide. In a specific example, a dry etching process, such as a SiCoNi etching may be employed to remove silicon oxide by using gas mixtures such as, for example, ammonia ($NH_3$) and nitrogen trifluoride ($NF_3$) in a plasma chamber.

Figure 1G:
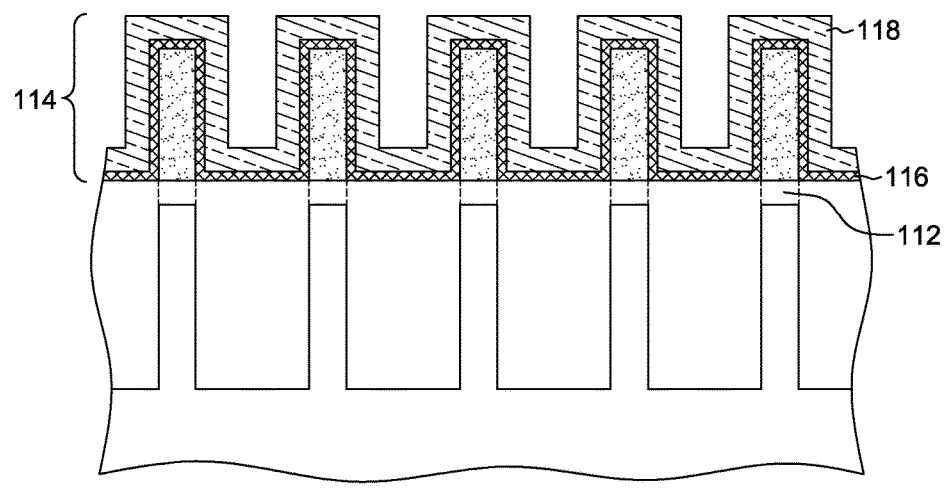
FIG. 1G depicts the structure of FIG. 1F after gate structure formation, in accordance with one or more aspects of the present invention.

FIG. 1G depicts the structure of FIG. 1F after one embodiment of gate structure formation processing. As illustrated, gate structure 114 extends over multiple modified fins 106', and includes, by way of example, a gate dielectric layer 116 and a gate metal 118. In one embodiment, gate dielectric layer 116 may be formed of a material such as, silicon dioxide or a high-k dielectric material with a dielectric constant k greater than about 3.9 (note that k=3.9 for $SiO_2$). In addition, the gate material 118 may include or be fabricated of a metal, and be formed as part of a gate-first formation process. Alternatively, in another embodiment, gate material 118 may include or be a sacrificial gate material, such as amorphous silicon (a-Si) or polycrystalline silicon (polysilicon), which may subsequently be replaced with a replacement gate material, as a part of a gate-last fabrication process. Note that the various layers discussed herein may be formed from a variety of different materials using a variety of techniques, for instance, atomic layer deposition (ALD) and chemical vapor deposition (CVD). The thickness of the layers may also vary, depending upon a particular application.

FIGS. 2A-2I depict one example of a method for fabricating an enhanced semiconductor structure such as, fin devices with, for instance, an isolation region within one or more fin structure(s). Advantageously, as described below, the fabricating method facilitates isolating semiconductor fin structure(s) with, for instance, alternative channel materials such as, for instance, silicon germanium materials from the underlying silicon material of the one or more fins by locally oxidizing the interface of the two materials of the fin(s) forming the isolation region therebetween.

Figure 2A:
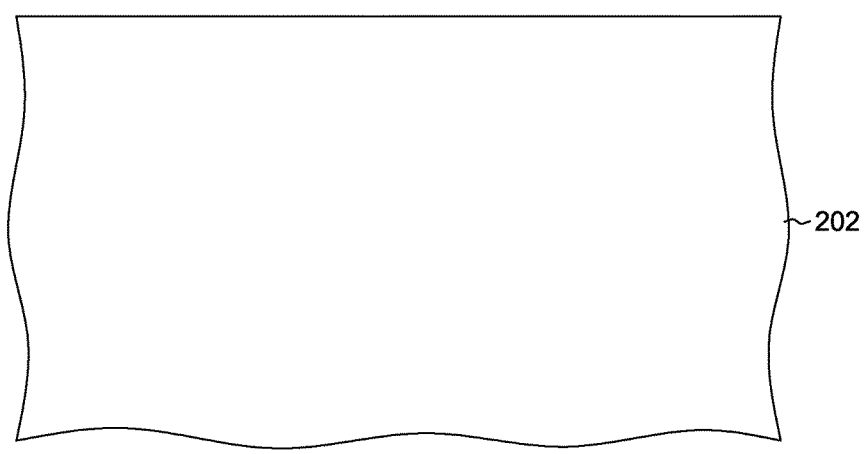
FIG. 2A is a cross-sectional view of another embodiment of an intermediate structure obtained during semiconductor structure fabrication process, in accordance with one or more aspects of the present invention.

FIG. 2A illustrates a cross-sectional view of an intermediate structure 200 obtained during fabrication of semiconductor fin structures, in accordance with one or more aspects of the present invention. As shown, structure 200 includes a substrate 202, which may be (in one example) a bulk semiconductor material such as a bulk silicon wafer. In a more specific example, substrate 102 may be or include a semiconductor material having any suitable crystallographic orientation, such as described above in connection with FIG. 1A. By way of example, the suitable crystallographic orientations of the silicon substrate layer may be, for instance, (100), (110) and (111) orientations. In another example, substrate 202 may include any silicon-containing substrate including, but not limited to, silicon (Si), single crystal silicon, polycrystalline Si, amorphous Si, silicon-on-nothing (SON), silicon-on-insulator (SOI), relaxed virtual silicon germanium (SiGe) substrates or silicon-on-replacement insulator (SRI) substrates or the like. Substrate 202 might be, for instance, approximately 600-700 micrometers thick, as one example only.

Figure 2B:
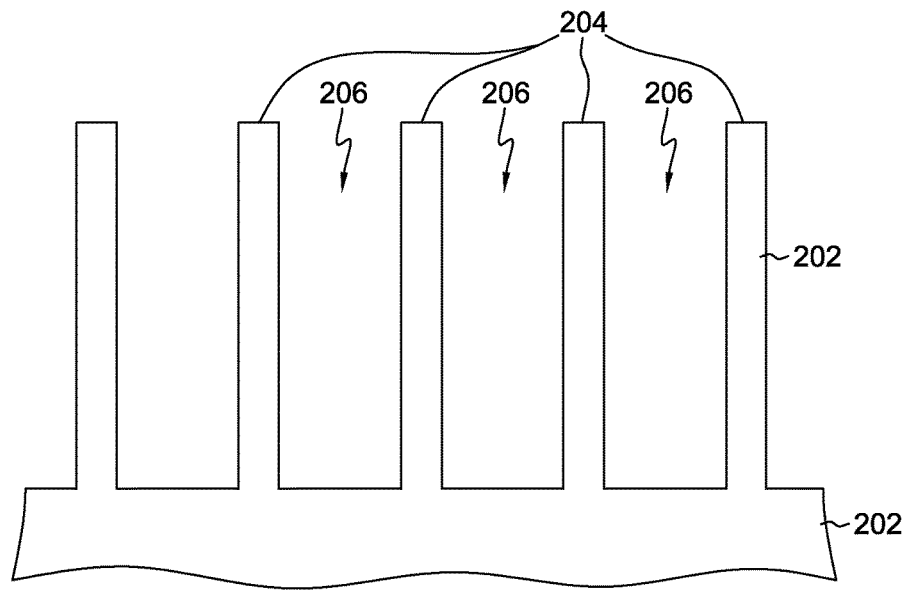
FIG. 2B depicts the intermediate structure of FIG. 2A after forming one or more intermediate fins, in accordance with one or more aspects of the present invention.

FIG. 2B illustrates the intermediate structure of FIG. 2A after formation of multiple semiconductor fins 204 extending above the substrate, each including a material of the silicon substrate. By way of example, the formation of semiconductor fins 204 may be accomplished utilizing, in part, patterning and removing processes described for forming fin structure(s) or fin(s) 106 with respect to FIG. 1B. As depicted and described above, the patterning and removing of portions of substrate 202 results in forming semiconductor fins 204 separated by spaces 206.

Figure 2C:
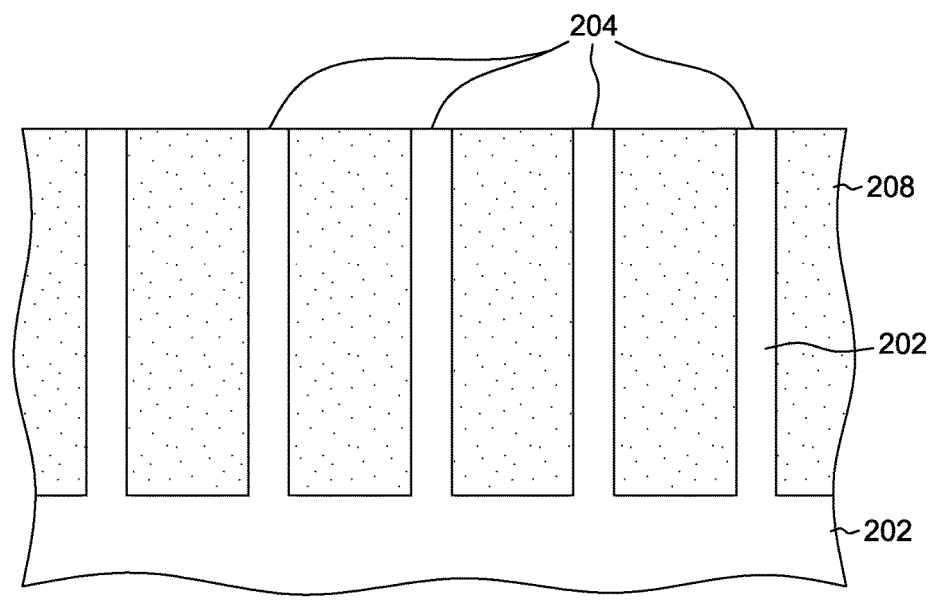
FIG. 2C depicts the intermediate structure of FIG. 2B after provision of an oxide layer over the structure, in accordance with one or more aspects of the present invention.

FIG. 2C depicts the intermediate structure of FIG. 2B after one or more fins 204 have been surrounded and/or overlaid with an oxide layer 208. The thickness of the oxide layer may be (in one example) sufficient to allow subsequent planarization of the structure. The oxide layer 208, which may be conformally deposited about the fin(s) may include or be fabricated of an oxide material such as, for instance high-aspect ratio process (HARP) oxide and may be formed using any of the deposition processes described for providing the oxide layer 110, with respect to FIG. 1C. Briefly, the oxide layer 208 may include or be fabricated of HARP oxide or flowable oxide material, depending upon the fabrication processing being employed.

Figure 2D:
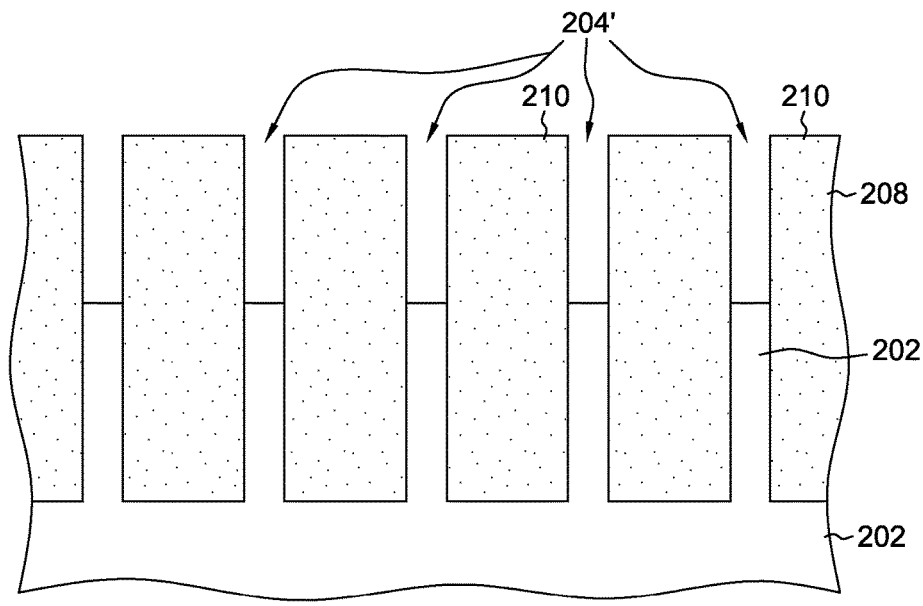
FIG. 2D depicts the intermediate structure of FIG. 2C after etching at least a portion of the intermediate fins, in accordance with one or more aspects of the present invention.

As depicted in FIG. 2D, one or more selective etch processes are performed to recess fin(s) 204, for instance, down from upper surfaces 210 of oxide layer 208, in accordance with one or more aspects of the present invention. By way of example, semiconductor material of fin(s) 204 may be selectively etched using one or more isotropic or anisotropic dry etching processes such as, reactive ion etching or plasma etching, hydrochloric acid (HCl) vapor etching processes. Although the height of the fin(s) being recessed depends on the technology nodes and the process parameters employed, in one example, the fin(s) may be recessed to a height of about 20 to 50% of a height of oxide layer 208.

Figure 2E:
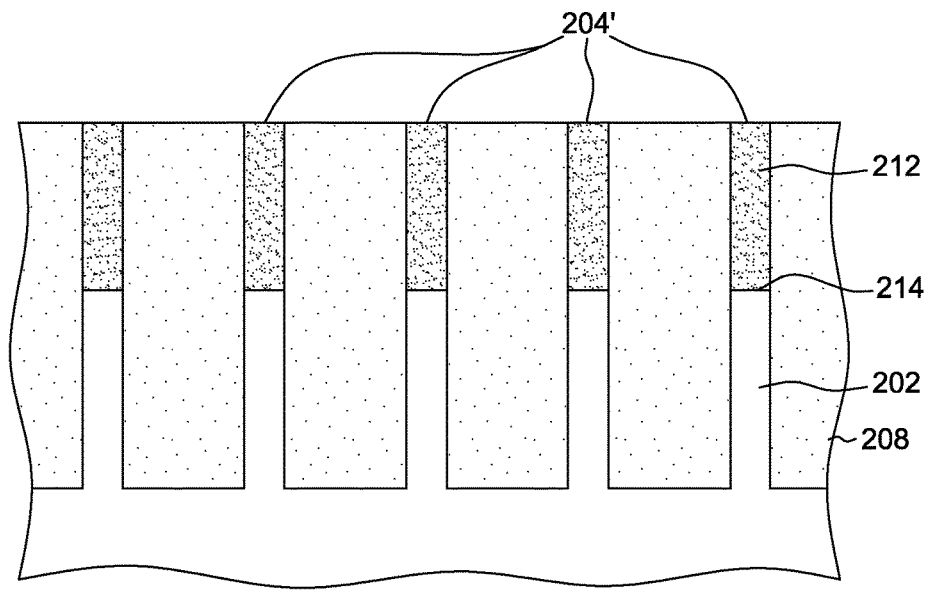
FIG. 2E depicts the intermediate structure of FIG. 2D after epitaxially growing a first fin material over the intermediate fins, in accordance with one or more aspects of the present invention.

FIG. 2E depicts the intermediate structure of FIG. 2D after epitaxially growing a material of the first fin portion 212 over the recessed fins 204' (FIG. 2E), in accordance with one or more aspects of the present invention. In one example, the material of the first fin portion 212 may be similar or identical to a material of the first fin layer 104, and may be formed using any of the deposition processes described for providing the first fin layer 104, with respect to FIG. 1A. In one example, the material of the first fin portion 212 may be or include an epitaxial single crystalline semiconductor layer. As described above, the material of the first fin portion 212 may include, for instance, a crystalline structure that is similar to that of the recessed silicon layer 202, and may include or be fabricated of a layer of silicon germanium, which may be expressed as $Si_{1-x}Ge_x$ wherein x, the atomic ratio of germanium in silicon, may be within a range of about 0.2 to 1. As a specific example, the atomic ratio of germanium present in the layer of silicon germanium may be about 0.5 or more. Note that, as described above, the silicon germanium portion defines the first fin portion, while the underlying silicon portion defines the second fin portion of the fin(s) 204'. The thickness of the material of the first fin portion may be (in one example) sufficient to allow subsequent planarization of the structure. Further, as described in connection with FIG. 1A, the difference in sizes of the crystalline lattice structures of the respective silicon germanium portion 212 and the underlying silicon portion 202 will lead to a difference in their respective lattice constants. By way of example, as described above, when a material layer having a lattice constant which is different than that of the substrate is forced to epitaxially grow on the substrate, the overlying material layer becomes intrinsically strained to conform to the lattice structure of the underlying substrate layer. Accordingly, as described and depicted in FIG. 1B, the substrate and the overlying silicon germanium portion have the same in-plane lattice constant along the height of the structure. The matching of the two lattice structures with different lattice constants in their relaxed state induces strain in the overlying silicon germanium portion and the amplitude of the strain is proportional to the difference in lattice constants in the relaxed state. The difference in lattice constants between silicon germanium portion 212 and underlying silicon portion 202 results in an intrinsically strained, and in particular, compressively strained silicon germanium portion over the silicon portion of the fin.

Figure 2F:
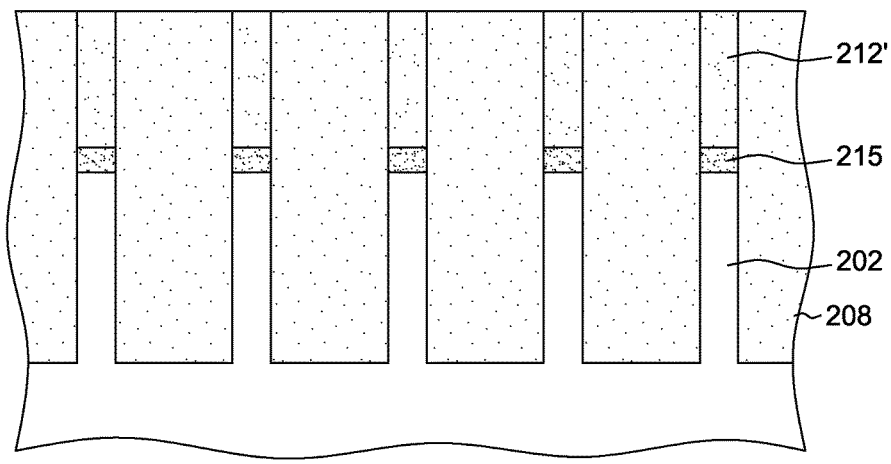
FIG. 2F depicts the intermediate structure of FIG. 2E with a sacrificial layer being disposed between the first and the second fin portions, in accordance with one or more aspects of the present invention

It may be the case that the atomic ratio of germanium present in the silicon germanium portion/layer 212 may be below the specific atomic concentration, for instance, may be within a range of about 0.2 to 0.5. In such a case, as shown in FIG. 2F, a thin fully strained silicon germanium layer 215 which, for instance, serves as an interface region, may be disposed between the silicon germanium layer 212' and the underlying silicon layer 202. As one would expect, the more germanium that remains at the interface region, the higher the likelihood of inducing an intrinsic strain within the interface region and the more susceptible the interface region would be to subsequent modification processes. As a specific example, the atomic ratio of germanium present in the fully-strained layer of silicon germanium 215 may be about 0.75 to 1. In one example, the thickness of the fully strained silicon germanium layer 215 may be within a range of about 2 to 5 nm.

Figure 2G:
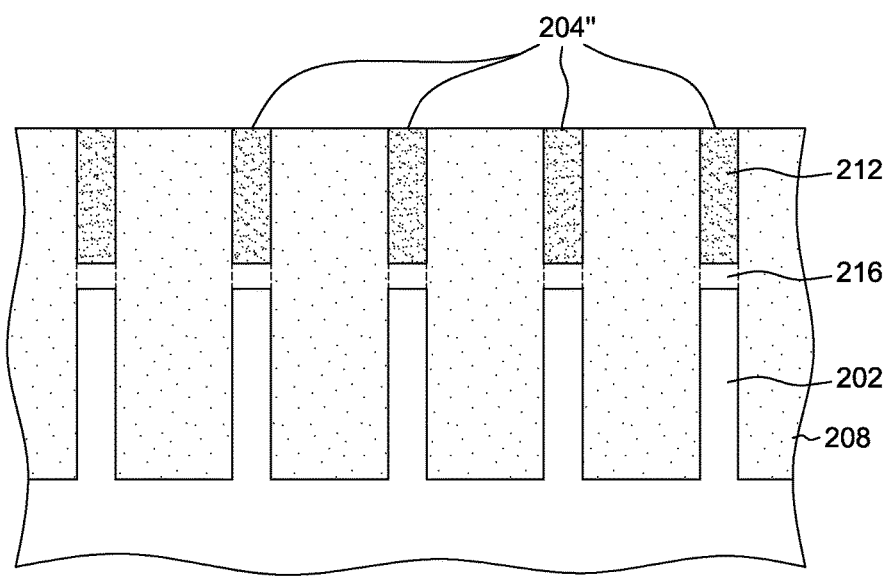
FIG. 2G depicts the intermediate structure of FIG. 2E with modified fin(s) including, for instance, an isolation region having been formed after oxidizing of the interface, in accordance with one or more aspects of the present invention.

FIG. 2G illustrates the intermediate structure of FIG. 2E after subjecting fin(s) 204' (FIG. 2E) to a modification process in the presence of oxide layer 208, to facilitate modifying the fins, while maintaining structural stability of the modified fins. The modification process may be accomplished by selectively oxidizing interface 214 (FIG. 2E) using, in part, the selective oxidation processes or annealing processes described for modifying the fin(s) 106, with respect to FIG. 1D. Briefly, the selective oxidation process may be performed, for instance, by subjecting fin(s) 204' (FIG. 2E) to a rapid thermal oxidation (RTO) procedure or by using a thermal annealing process. Further, as depicted and described above in connection with FIG. 1D, the modification process of the fin(s) facilitates oxidizing interface 214 selectively compared to the remaining portions of the silicon germanium layer and the underlying silicon layer resulting in a modified fin structure 204" and forming an isolation region 216 which, for instance, facilitates electrically insulating silicon germanium layer 212 from underlying silicon layer 202. In another embodiment, in the case of silicon germanium layer having a lower atomic concentration, fully-strained silicon germanium layer 215 (FIG. 2F) being employed as interface region, may also be oxidized selectively using, in part, the selective oxidation processes or annealing processes described for modifying the fins(s) 106, with respect to FIG. 1D. In such case, the fully-strained silicon germanium layer may be selectively oxidized to form the isolation region 216 which, for instance, facilitates electrically insulating silicon germanium layer 212 from underlying silicon layer 202. In one example, the isolation region 216 may be or include an oxide material such as, for instance, silicon oxide material. For instance, the silicon atoms of the silicon germanium layer and the silicon layer at the interface, owing to the intrinsic strain, may be oxidized, under the oxidation or annealing processes, to form the oxide material, for instance, silicon oxide material, resulting in the isolation region.

Figure 2H:
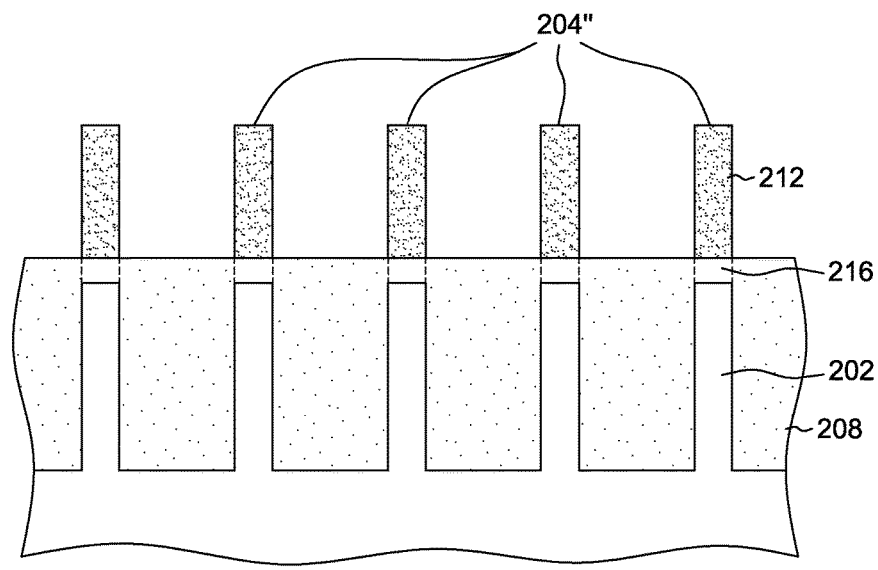
FIG. 2H depicts the intermediate structure of FIG. 2G after recessing the overlying oxide layer to reveal a portion of the modified fins, in accordance with one or more aspects of the present invention.

As depicted in FIG. 2H, further processing of the structure of FIG. 2G may be performed to reveal the isolated silicon germanium layers 212 of modified fin(s) 204". The recessing of the oxide layer 208 may be accomplished using, in part, one or more conventional isotropic wet etching processes or anisotropic dry etching processes such as, reactive ion etching or plasma processes described for recessing of the oxide layer 110, with respect to FIG. 1E.

Figure 2I:
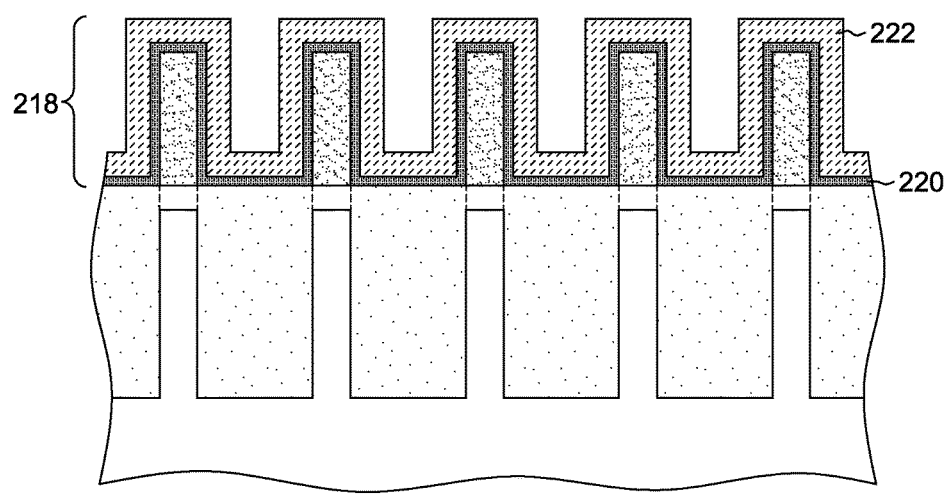
FIG. 2I depicts the structure of FIG. 2H after gate structure formation, in accordance with one or more aspects of the present invention.

FIG. 2I depicts the structure of FIG. 2H after one embodiment of gate structure formation processing which, for instance, may be accomplished using, in part, the fabrication processes described for the formation of gate structure 114, with respect to FIG. 1F. The result is that gate structure 218 may be formed extending over multiple modified fins 204" and may include a gate dielectric layer 220 and a gate metal 118.

Advantageously, one skilled in the art will note that the fabrication processing of FIGS. 1A-1G and FIGS. 2A-2I facilitate fabricating an enhanced semiconductor structure such as, fin devices with, for instance, an isolation region within one or more fin structure(s), which facilitates isolating semiconductor fin structure(s) such as, silicon germanium fins from the underlying silicon portions of the one or more fins.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating a semiconductor fin structure, the fabricating comprising:
      providing a fin structure extending above a substrate, the fin structure including a first fin portion, a second fin portion disposed over the first fin portion, and an interface between the first and the second fin portions, wherein the first fin portion and the second fin portion are lattice mismatched within the fin structure, the providing comprising:
         providing a multi-layer structure, the multi-layer structure comprising:
         the substrate comprising a first fin layer;
         a sacrificial layer over the substrate;
         a second fin layer disposed over the sacrificial layer; and
         removing at least a portion of the multi-layer structure to create the fin structure, the fin structure comprising a region of the second fin portion disposed over a region of the first fin portion, with a portion of the sacrificial layer disposed therebetween;
      modifying, in part, the fin structure to obtain a modified fin structure, the modifying comprising selectively oxidizing, utilizing a rapid thermal process, the interface to form an isolation region within the modified fin structure, wherein the isolation region electrically insulates the first fin portion from the second fin portion, while maintaining structural stability of the modified fin structure;
      modifying, in part, the fin structure to obtain the modified fin structure, the modifying comprising oxidizing the sacrificial layer of the fin structure, while maintaining structural stability, wherein the oxidized sacrificial layer provides the isolation region; and
      wherein the first fin portion comprises a silicon material, and wherein the sacrificial layer and the second fin layer comprise an intrinsically strained silicon germanium material having varying atomic ratios of germanium to silicon disposed therein, the atomic ratio of germanium to silicon disposed within the sacrificial layer being higher than the atomic ratio of germanium to silicon disposed within the first fin layer.

2. The method of claim 1, wherein the selectively oxidizing comprises selectively oxidizing the interface with a controlled oxidation process which extends oxidation into at least a portion of the first and the second fin portions forming the isolation region, while inhibiting the oxidation of any remaining portions of the first and the second fin portions.

3. The method of claim 2, wherein the selectively oxidizing comprises oxidizing the fin structure using an oxidizing time which facilitates selectively oxidizing the interface to a desired thickness, the oxidizing time being selected to inhibit oxidizing of the remaining portions of the first and the second fin portions.

4. The method of claim 3, wherein the isolation region has a desired thickness within a range of about 5 to 15 nm.

5. The method of claim 4, wherein the modifying comprises performing an oxidation process of the fin structure, in the presence of an oxygen process gas, to locally oxidize the interface within the fin structure, and form the isolation region within the modified fin structure.

6. The method of claim 2, wherein the modifying comprises disposing an oxide layer about the fin structure to mechanically stabilize the fin structure, wherein the oxide layer facilitates oxidizing of the fin structure selectively at the interface, and inhibiting oxidizing of the remaining portions of the first fin portion or the second fin portion.

7. The method of claim 6, wherein the modifying comprises annealing the fin structure in the absence of oxygen process gas to selectively oxidize the interface to obtain the isolation region, wherein the oxide layer provides oxygen atoms to facilitate oxidizing of the interface.

8. The method of claim 1, wherein the first fin portion and the substrate comprise a silicon material, and the second fin portion comprises an intrinsically strained silicon germanium material with a specific atomic ratio of germanium to silicon disposed therein.

9. The method of claim 8, wherein the specific atomic ratio of germanium to silicon of the intrinsically strained silicon germanium material is about 0.5 or more.

10. The method of claim 8, wherein the selectively oxidizing comprises selecting the specific atomic ratio of germanium to silicon of the intrinsically strained silicon germanium material which facilitates determining an oxidizing time employed in the oxidizing of the interface.

11. The method of claim 1, wherein the second fin portion comprises a material with a first lattice constant, and the first fin portion and the substrate comprise a material with a second lattice constant, the first and the second lattice constants being different lattice constants, and the second fin portion with the first lattice constant and the first fin portion with the second lattice constant induce an intrinsic strain within the second fin portion.

12. The method of claim 1, wherein providing the fin structure comprises:
providing a bi-layer structure, the bi-layer structure comprising:
the substrate comprising the first fin layer;
the second fin layer disposed over the substrate; and
removing at least a portion of the bi-layer structure to create the fin structure, the fin structure comprising a region of the first fin portion, a region of the second fin portion disposed above the region of the first fin portion, and the interface between the first and the second fin portions.

13. The method of claim 1, wherein the atomic ratio of germanium to silicon disposed within the sacrificial layer is about 0.5 or more, and the atomic ratio of germanium to silicon disposed within the first fin layer is within a range of about 0.25 to 0.5.

14. A method comprising:
fabricating a semiconductor fin structure, the fabricating comprising:
providing a fin structure extending above a substrate, the fin structure including a first fin portion, a second fin portion disposed over the first fin portion, and an interface between the first and the second fin portions, wherein the first fin portion and the second fin portion are lattice mismatched within the fin structure; and
modifying, in part, the fin structure to obtain a modified fin structure, the modifying comprising selectively oxidizing the interface to form an isolation region within the modified fin structure, wherein the isolation region electrically insulates the first fin portion from the second fin portion, while maintaining structural stability of the modified fin structure, wherein the selectively oxidizing comprises selectively oxidizing the interface with a controlled oxidation process which extends oxidation into at least a portion of the first and the second fin portions forming the isolation region, while inhibiting the oxidation of any remaining portions of the first and the second fin portions, wherein the modifying comprises disposing an oxide layer about the fin structure to mechanically stabilize the fin structure, wherein the oxide layer facilitates oxidizing of the fin structure selectively at the interface, and inhibiting oxidizing of the remaining portions of the first fin portion or the second fin portion, and wherein the modifying comprises annealing the fin structure in the absence of oxygen process gas to selectively oxidize the interface to obtain the isolation region, wherein the oxide layer provides oxygen atoms to facilitate oxidizing of the interface.

* * * * *